(12) United States Patent
Terasaki et al.

(10) Patent No.: US 10,526,252 B2
(45) Date of Patent: Jan. 7, 2020

(54) CERAMIC/ALUMINUM JOINED BODY, INSULATING CIRCUIT BOARD, POWER MODULE, LED MODULE, AND THERMOELECTRIC MODULE

(71) Applicant: MITSUBISHI MATERIALS CORPORATION, Tokyo (JP)

(72) Inventors: Nobuyuki Terasaki, Saitama (JP); Yoshiyuki Nagatomo, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 15/778,694

(22) PCT Filed: Nov. 8, 2016

(86) PCT No.: PCT/JP2016/083097
§ 371 (c)(1),
(2) Date: May 24, 2018

(87) PCT Pub. No.: WO2017/090422
PCT Pub. Date: Jun. 1, 2017

(65) Prior Publication Data
US 2018/0346387 A1    Dec. 6, 2018

(30) Foreign Application Priority Data

Nov. 26, 2015  (JP) ................................ 2015-231040
Sep. 13, 2016  (JP) ................................ 2016-178530

(51) Int. Cl.
*H01L 23/495*   (2006.01)
*C04B 37/02*    (2006.01)
(Continued)

(52) U.S. Cl.
CPC .............. *C04B 37/02* (2013.01); *H01L 23/13* (2013.01); *H01L 23/3735* (2013.01);
(Continued)

(58) Field of Classification Search
CPC ..... H01L 23/12; H01L 23/40; H01L 23/3735; C04B 37/02; C04B 37/025; B23K 1/0016
(Continued)

(56) References Cited

U.S. PATENT DOCUMENTS 6,309,737 B1 * 10/2001 Hirashima ............ C04B 37/026
174/258
6,613,443 B2 * 9/2003 Komatsu ............... C04B 35/584
257/703
(Continued)

FOREIGN PATENT DOCUMENTS

EP    2006895 A1    12/2008
EP    2484957 A1    8/2012
(Continued)

OTHER PUBLICATIONS

Yoshiaki Arata et al., "Basic research on the diffusion welding of silicon nitride sintered body 1" Pre-Prints of the National Meeting of JWS, Apr. 1986, 38th series, pp. 54 to 55. (cited in the ISR—see the ISR which serves as a concise explanation).
(Continued)

*Primary Examiner* — Nitin Parekh
(74) *Attorney, Agent, or Firm* — Locke Lord LLP

(57) ABSTRACT

A joined body according to the invention is a ceramic/aluminum joined body including: a ceramic member; and an aluminum member made of aluminum or an aluminum alloy, in which the ceramic member and the aluminum member are joined to each other, the ceramic member is formed of silicon nitride containing magnesium, and a joining layer in which magnesium is contained in an aluminum-silicon-oxygen-nitrogen compound is formed at a joining interface between the ceramic member and the aluminum member.

7 Claims, 3 Drawing Sheets

(51) Int. Cl.
 *H01L 23/13* (2006.01)
 *H01L 23/373* (2006.01)
 *H05K 1/03* (2006.01)
 *H05K 1/05* (2006.01)
 *H01L 23/40* (2006.01)

(52) U.S. Cl.
 CPC ........... *H01L 23/40* (2013.01); *H05K 1/0306* (2013.01); *H05K 1/05* (2013.01); *H01L 2224/32225* (2013.01)

(58) Field of Classification Search
 USPC .................................................. 257/701, 703
 See application file for complete search history.

(56) References Cited

U.S. PATENT DOCUMENTS

| | | | | |
|---|---|---|---|---|
| 8,071,187 B2* | 12/2011 | Yamamoto | ............. | H01L 23/10 257/676 |
| 2002/0164475 A1* | 11/2002 | Imamura | ............... | C01B 21/068 428/325 |
| 2004/0062009 A1* | 4/2004 | Osanai | ................ | H01L 23/3735 361/709 |
| 2011/0067906 A1 | 3/2011 | Kuromitsu et al. | | |
| 2011/0272187 A1* | 11/2011 | Kaga | .................... | C04B 35/584 174/260 |
| 2012/0080216 A1* | 4/2012 | Abe | ................... | B23K 35/3006 420/489 |
| 2012/0281362 A1* | 11/2012 | Ishimine | ................. | H01L 23/13 361/707 |
| 2014/0192486 A1* | 7/2014 | Kuromitsu | .......... | H01L 23/3735 361/715 |
| 2016/0181123 A1* | 6/2016 | Terasaki | .............. | H01L 23/3735 228/122.1 |
| 2017/0141011 A1* | 5/2017 | Oohiraki | .................. | B32B 7/05 |

FOREIGN PATENT DOCUMENTS

| | | |
|---|---|---|
| JP | 61-275174 A | 12/1986 |
| JP | 3171234 B2 | 5/2001 |
| JP | 2009-277991 A | 11/2009 |
| JP | 2013-182960 A | 9/2013 |
| WO | 2007105361 A1 | 9/2007 |
| WO | 2011/004798 A1 | 1/2011 |

OTHER PUBLICATIONS

International Search Report dated Dec. 27, 2016, issued for PCT/JP2016/083097 and English translation thereof.

* cited by examiner

CERAMIC/ALUMINUM JOINED BODY, INSULATING CIRCUIT BOARD, POWER MODULE, LED MODULE, AND THERMOELECTRIC MODULE

TECHNICAL FIELD

The present invention relates to a ceramic/aluminum joined body and an insulating circuit board in which a ceramic member and an aluminum member made of aluminum or an aluminum alloy are joined to each other, and a power module, a LED module, and a thermoelectric module which have the insulating circuit board.

Priority is claimed on Japanese Patent Application No. 2015-231040, filed on Nov. 26, 2015, and Japanese Patent Application No. 2016-178530, filed on Sep. 13, 2016, the contents of which are incorporated herein by reference.

BACKGROUND ART

Power modules, LED modules, or thermoelectric modules have a structure in which a power semiconductor element, a LED element, and a thermoelectric element are joined on a circuit layer made of a conductive material.

For example, power semiconductor elements for high-power control, which are used to control wind-power generation, electric vehicles, hybrid vehicles, or the like, require a large amount of energy in operation, and thus a ceramic substrate (insulating layer) formed of silicon nitride ($Si_3N_4$) having excellent heat resistance and an excellent insulating properties is widely used as a substrate on which the power semiconductor element is mounted.

An insulating circuit board (substrate for power module) is provided in which a metal plate having excellent conductive properties is joined to one surface of a ceramic substrate (insulating layer) to form a circuit layer. A metal layer having excellent heat-radiating properties is integrally joined to the opposing surface.

For example, a power module shown in PTL 1 has a structure having: an insulating circuit board (substrate for power module) in which a circuit layer formed of an aluminum plate and a metal layer formed of an aluminum plate are respectively formed on one surface and the other surface of a ceramic substrate; and a semiconductor element which is joined on the circuit layer via a solder material.

In addition, a configuration is employed in which a heat sink is joined on the metal layer side of the insulating circuit board (substrate for power module), and the heat transferred from the semiconductor element to the insulating circuit board (substrate for power module) side is diffused to the outside via the heat sink.

CITATION LIST

Patent Literature

[PTL 1] Japanese Patent No. 3171234

SUMMARY OF INVENTION

Technical Problem

Regarding the above-described insulating circuit board (substrate for power module), an example has been shown in which an Al—Si-based brazing filler material or the like is used for joining a ceramic substrate to an aluminum plate, but in joining between a ceramic substrate (insulating layer) formed of silicon nitride ($Si_3N_4$) and an aluminum plate, the joining strength cannot be sufficiently maintained due to the influence of a sintering aid or the like on the ceramic substrate.

Particularly, an insulating circuit board (substrate for power module) in which a repetitive thermal cycle is applied between a high-temperature state caused by heat generation during the operation of the power semiconductor element and a low-temperature state during the non-operation has a problem in that the joining reliability is likely to decrease between the ceramic substrate (insulating layer) and the metal layer.

The invention is contrived in view of the above-described circumstances, and an object thereof is to provide a ceramic/aluminum joined body and an insulating circuit board in which an aluminum member is joined to a ceramic member formed of silicon nitride with high joining reliability, and a power module, a LED module, and a thermoelectric module which have the insulating circuit board.

Solution to Problem

In order to solve the problems, a joined body according to the invention is a ceramic/aluminum joined body including: a ceramic member; and an aluminum member made of aluminum or an aluminum alloy, in which the ceramic member and the aluminum member are joined to each other, the ceramic member is formed of silicon nitride containing magnesium, and a joining layer in which magnesium is contained in an aluminum-silicon-oxygen-nitrogen compound is formed at a joining interface between the ceramic member and the aluminum member.

According to the joined body of the invention, the joining layer containing magnesium and formed at the joining interface between the ceramic member and the aluminum member is formed deeper in a thickness direction in the ceramic member than in a case where little magnesium exists at the joining interface. That is, by virtue of the presence of magnesium, the compound with a magnesium-containing sialon (SiAlON) structure is formed up to a deeper region in the ceramic member. Accordingly, the joining strength between the ceramic member and the aluminum member is increased, and thus the joining reliability of the joined body can be improved.

A composition ratio of the joining layer is preferably specified such that silicon is 10 at % to 18 at %, oxygen is 20 at % to 35 at %, nitrogen is 25 at % to 40 at %, and magnesium is 3 at % to 8 at % with the balance aluminum.

By adjusting the composition ratio of the joining layer within the above-described range, the compound with a magnesium-containing sialon structure constituting the joining layer is formed up to a deeper region in the ceramic member, and thus the joining strength between the ceramic member and the aluminum member can be increased.

In a case where the magnesium concentration of the joining layer is less than 3 at %, there is a concern that a non-uniform joining layer may be formed, and thus the joining property may decrease. In a case where the magnesium concentration is greater than 8 at %, an excessive amount of magnesium exists, and thus there is a concern that the joining layer may become brittle, and thus the joining reliability may decrease.

In the joined body according to the invention, a copper concentration is preferably 1.2 mass % or less and an iron concentration is preferably 0.6 mass % or less at a position separated by 10 μm from a surface of the ceramic member toward the aluminum member.

In this case, since the copper concentration is 1.2 mass % or less and the iron concentration is 0.6 mass % or less in the vicinity of the joining interface, it is possible to suppress excessive hardening of the vicinity of the joining interface with the ceramic member in the aluminum member, and thus it is possible to suppress the occurrence of fractures or the like of the ceramic member.

An insulating circuit board according to the invention includes a ceramic substrate; and an aluminum plate made of aluminum or an aluminum alloy, in which the ceramic substrate and the aluminum plate are joined to each other, the ceramic substrate is formed of silicon nitride containing magnesium, and a joining layer in which magnesium is contained in an aluminum-silicon-oxygen-nitrogen compound is formed at a joining interface between the ceramic substrate and the aluminum plate.

According to the insulating circuit board of the invention, the joining layer containing magnesium and formed at the joining interface between the ceramic substrate and the aluminum plate made of aluminum or an aluminum alloy is formed deeper in a thickness direction in the ceramic substrate than in a case where little magnesium exists at the joining interface. That is, by virtue of the presence of magnesium, a compound with a magnesium-containing sialon structure is formed up to a deeper region in the ceramic substrate. Accordingly, the joining strength between the ceramic substrate and the aluminum plate is increased, and thus the joining reliability of the insulating circuit board can be improved.

A composition ratio of the joining layer is preferably specified such that silicon is 10 at % to 18 at %, oxygen is 20 at % to 35 at %, nitrogen is 25 at % to 40 at %, and magnesium is 3 at % to 8 at % with the balance aluminum.

By adjusting the composition ratio of the joining layer within the above-described range, the compound with a magnesium-containing sialon structure constituting the joining layer is formed up to a deeper region in the ceramic substrate, and thus the joining strength between the ceramic substrate and the aluminum plate can be increased.

In a case where the magnesium concentration of the joining layer is less than 3 at %, there is a concern that a non-uniform joining layer may be formed, and thus the joining property may decrease. In a case where the magnesium concentration is greater than 8 at %, an excessive amount of magnesium exists, and thus there is a concern that the joining layer may become brittle, and thus the joining reliability may decrease.

In the insulating circuit board according to the invention, a copper concentration is preferably 1.2 mass % or less and an iron concentration is preferably 0.6 mass % or less at a position separated by 10 μm from a surface of the ceramic substrate toward the aluminum plate.

In this case, since the copper concentration is 1.2 mass % or less and the iron concentration is 0.6 mass % or less in the vicinity of the joining interface, it is possible to suppress excessive hardening of the vicinity of the joining interface with the ceramic substrate in the aluminum plate, and thus it is possible to suppress the occurrence of fractures or the like of the ceramic substrate.

A power module according to the invention includes: the above-described insulating circuit board; and a power semiconductor element which is mounted on the insulating circuit board.

A LED module according to the invention includes: the above-described insulating circuit board; and a LED element which is mounted on the insulating circuit board.

A thermoelectric module according to the invention includes: the above-described insulating circuit board; and a thermoelectric element which is mounted on the insulating circuit board.

According to the power module, the LED module, and the thermoelectric module of the invention, the joining layer containing magnesium and formed at the joining interface between the ceramic substrate and the aluminum plate made of aluminum or an aluminum alloy is formed deeper in a thickness direction in the ceramic substrate than in a case where little magnesium exists at the joining interface. That is, by virtue of the presence of magnesium, the compound with a magnesium-containing sialon structure is formed up to a deeper region in the ceramic substrate. Accordingly, the joining strength between the ceramic substrate and the aluminum plate is increased, and thus the joining reliability of the power module, the LED module, and the thermoelectric module can be improved.

Advantageous Effects of Invention

According to the invention, it is possible to provide a ceramic/aluminum joined body and an insulating circuit board in which an aluminum member is joined to a ceramic member formed of silicon nitride with high joining reliability, and a power module, a LED module, and a thermoelectric module which have the insulating circuit board.

DESCRIPTION OF EMBODIMENTS

Figure 1:
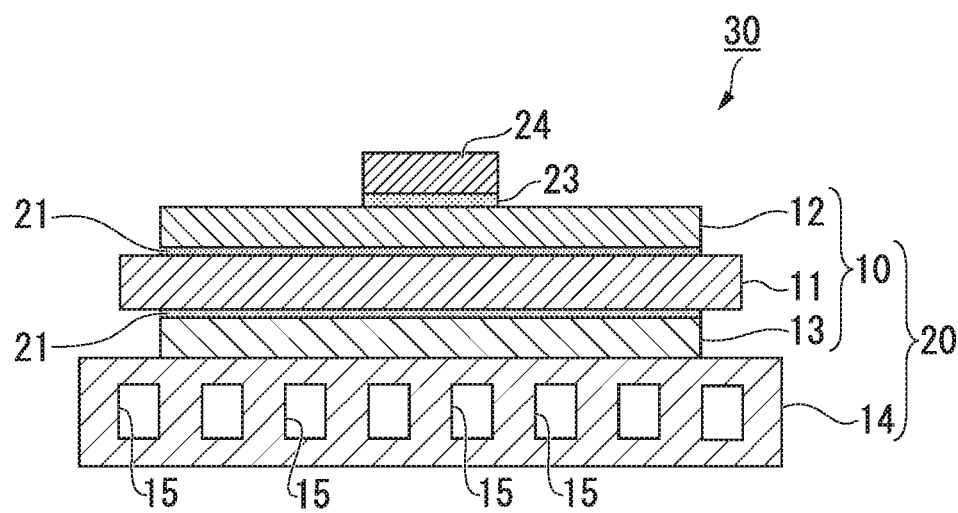
FIG. 1 is a cross-sectional view illustrating a ceramic/aluminum joined body and a power module according to a first embodiment.

Hereinafter, embodiments of the invention will be described with reference to the drawings. The following embodiments will be described in detail for better understanding of the purpose of the invention, although the invention is not limited thereto unless otherwise specified. In the drawings used for the following description, a major part may be illustrated in an enlarged manner for convenience in order to make the description of the characteristics of the invention easier to understand, so that the dimensional ratios and the like of the constituent elements may differ from the actual elements. In the following description, the "brazing filler material" is not essentially limited to a lead-containing material.

Hereinafter, embodiments of the invention will be described with reference to the accompanying drawings.

First Embodiment

FIG. 1 is a cross-sectional view illustrating a ceramic/aluminum joined body and an insulating circuit board according to a first embodiment.

The ceramic/aluminum joined body according to this embodiment is an insulating circuit board 10 having a ceramic substrate 11 as a ceramic member, a circuit layer 12 formed by joining of an aluminum plate as an aluminum member, and a metal layer 13 formed by joining an aluminum plate as an aluminum member.

A power module 30 according to this embodiment is formed by mounting a semiconductor element 24 such as a power semiconductor element on the circuit layer 12 of the insulating circuit board 10 via a solder layer 23.

In this embodiment, a cooler 14 is formed on a surface of the metal layer 13 on the side opposite to the ceramic substrate 11 to provide an insulating circuit board 20 with a cooler.

The ceramic substrate (ceramic member) 11 is formed of a ceramic material in which magnesium (Mg) is contained in at least a surface of $Si_3N_4$ (silicon nitride) having excellent insulating and heat-radiating properties. The thickness of the ceramic substrate 11 is set within a range of, for example, 0.2 to 1.5 mm, and in this embodiment, the thickness is set to 0.32 mm.

The circuit layer 12 is formed by joining an aluminum or aluminum alloy plate (aluminum member) to one surface (upper surface in FIGS. 1 and 2) of the ceramic substrate 11. The aluminum or aluminum alloy plate (aluminum member) is formed of a rolled plate of aluminum with a purity of 99 mass % or greater (2-N aluminum), aluminum with a purity of 99.9 mass % or greater, aluminum with a purity of 99.99 mass % or greater, or the like. In this embodiment, aluminum with a purity of 99 mass % or greater (2-N aluminum) is used. The thickness of the circuit layer 12 is set within a range of, for example, 0.1 mm to 1.0 mm, and in this embodiment, the thickness is set to 0.6 mm.

The metal layer 13 is formed by joining an aluminum or aluminum alloy plate (aluminum member) to the other surface (lower surface in FIGS. 1 and 2) of the ceramic substrate 11. The aluminum or aluminum alloy plate (aluminum member) is formed of a rolled plate of aluminum with a purity of 99 mass % or greater (2-N aluminum), aluminum with a purity of 99.9 mass % or greater, aluminum with a purity of 99.99 mass % or greater, or the like. In this embodiment, aluminum (2-N aluminum) with a purity of 99 mass % or greater is used. The thickness of the metal layer 13 is set within a range of, for example, 0.1 mm to 3.0 mm, and in this embodiment, the thickness is set to 2.1 mm.

Figure 2:
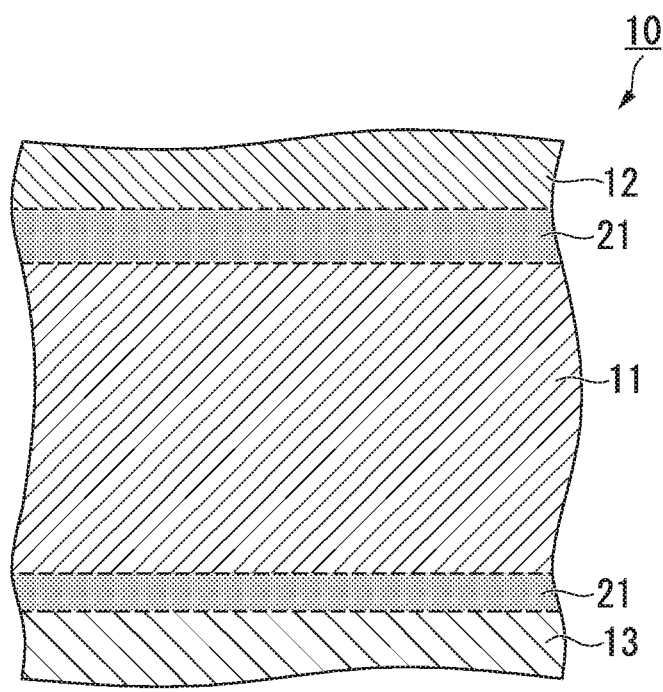
FIG. 2 is an enlarged cross-sectional view of a major part illustrating the vicinity of joining interfaces of the ceramic/aluminum joined body according to the first embodiment.

FIG. 2 is an enlarged cross-sectional view of a major part illustrating a region including joining interfaces between the ceramic substrate 11 and the circuit layer 12 and between the ceramic substrate 11 and the metal layer 13.

The ceramic substrate (ceramic member) 11, the circuit layer (aluminum member, aluminum plate) 12, and the metal layer (aluminum member, aluminum plate) 13 constituting the insulating circuit board (ceramic/aluminum joined body) 10 are respectively joined using an Al—Si-based brazing filler material. At the joining interfaces between the ceramic substrate 11 and the circuit layer 12 and between the ceramic substrate 11 and the metal layer 13, a joining layer 21 in which magnesium (Mg) is contained in an aluminum (Al)-silicon (Si)-oxygen (O)-nitrogen (N) compound is formed.

The joining layer 21 is a layer formed at the joining interface between one surface of the ceramic substrate 11 and the circuit layer 12, and at the joining interface between the other surface of the ceramic substrate 11 and the metal layer 13 in the joining the circuit layer 12 and the metal layer 13 to the ceramic substrate 11 using an Al—Si-based brazing filler material. The joining layer 21 is formed from a SiAlON compound containing Mg within a predetermined concentration range.

The SiAlON compound mentioned herein forms a sialon structure by substitution of a part of silicon atoms with aluminum atoms and substitution of a part of nitrogen atoms with oxygen atoms, and in the joining layer 21, magnesium is contained in a part of the sialon structure. Magnesium is contained in the form such that a part of elements forming the sialon structure is substituted with the magnesium, or the magnesium is further added to the sialon structure. The magnesium contained in the joining layer 21 is derived from the ceramic substrate (ceramic member) 11 formed of $Si_3N_4$ (silicon nitride) containing magnesium.

The composition ratio of the elements of the joining layer 21 is specified such that silicon is 10 at % to 18 at %, oxygen is 20 at % to 35 at %, nitrogen is 25 at % to 40 at %, and magnesium is 3 at % to 8 at % with the balance aluminum. A preferable composition ratio of the joining layer 21 is as follows, but not limited to: 12 at % to 16 at % of silicon, 24 at % to 32 at % of oxygen, 28 at % to 36 at % of nitrogen, and 4.0 at % to 7.5 at % of magnesium (more preferably, 4.8 at % to 6.9 at %) with the balance aluminum. As an example of the composition ratio of the joining layer 21, silicon is 14.1 at %, oxygen is 29.1 at %, nitrogen is 32.9 at %, magnesium is 6.3 at %, and aluminum is 17.7 at %.

The thickness of the joining layer 21 is preferably 1.0 nm to 10 nm, and more preferably 1.0 nm to 7 nm, but is not limited thereto.

The joining layer 21 is formed deeper in a thickness direction (inside) of the ceramic substrate 11 than in a case where little magnesium exists at the joining interfaces between the ceramic substrate 11 and the circuit layer 12 and between the ceramic substrate 11 and the metal layer 13. That is, by virtue of the presence of magnesium, the compound with a magnesium-containing sialon structure is formed up to a deeper region in the ceramic substrate 11. Accordingly, the joining strengths between the ceramic substrate 11 and the circuit layer 12 and between the ceramic substrate 11 and the metal layer 13 are increased, and thus the joining reliability is improved.

In addition, at the joining interfaces between the ceramic substrate (ceramic member) 11 and the circuit layer (aluminum member) 12 and between the ceramic substrate 11 and the metal layer (aluminum member) 13, the copper concentration at positions separated by 10 μm from the surface of the ceramic substrate (ceramic member) 11 toward the circuit layer (aluminum member) 12 and the metal layer (aluminum member) 13 is preferably 1.2 mass % or less and the iron concentration at positions separated by 10 μm from the surface of the ceramic substrate (ceramic member) 11 toward the circuit layer (aluminum member) 12 and the metal layer (aluminum member) 13 is 0.6 mass % or less.

In a case where the copper concentration is 1.2 mass % or less and the iron concentration is 0.6 mass % or less, it is possible to suppress excessive hardening of the vicinity of the joining interface with the ceramic substrate 11 in the circuit layer 12 and the metal layer 13. Accordingly, it is possible to suppress the occurrence of fractures or cracks of the ceramic substrate 11. It is preferable that the lower limit of the copper concentration be 0 mass % and the lower limit of the iron concentration be 0 mass %, it is more preferable that the copper concentration be 0 mass % to 0.1 mass % and the iron concentration be 0 mass % to 0.1 mass %, and it is even more preferable that the copper concentration be 0 mass % to 0.02 mass % and the iron concentration be 0 mass % to 0.02 mass %. However, the above concentrations are not limited thereto. 0 mass % includes a value that is equal to or less than a measurement limit value of the measuring device.

The cooler 14 is provided to efficiently diffuse the heat of the insulating circuit board 10, and in the insulating circuit board 20 with a cooler according to this embodiment, a plurality of flow paths 15 through which a cooling medium circulates are provided as illustrated in FIG. 1. The cooler 14 is made of, for example, an aluminum alloy, and in this embodiment, the cooler is made of A6063. The cooler 14 and the metal layer 13 are, for example, directly joined to each other by an Al—Si-based brazing filler material.

According to the insulating circuit board (ceramic/aluminum joined body) 10 and the power module 30 configured as described above, the joining reliability can be increased between the ceramic substrate 11 and the circuit layer 12 and between the ceramic substrate 11 and the metal layer 13 in a case where $Si_3N_4$ (silicon nitride) containing magnesium in at least a surface thereof is used as the ceramic substrate (ceramic member) 11, and the joining layer 21 in which a SiAlON compound contains Mg within a predetermined concentration range is formed at the joining interface between one surface of the ceramic substrate 11 and the circuit layer (aluminum member, aluminum plate) 12, and at the joining interface between the other surface of the ceramic substrate 11 and the metal layer (aluminum member, aluminum plate) 13.

Accordingly, for example, even under an environment in which a repetitive thermal cycle is applied between a high-temperature state caused by the heat generation of the semiconductor element 24 and a low-temperature state during the non-operation, it is possible to securely prevent the occurrence of fractures or cracks at the joining interfaces between the ceramic substrate 11 and the circuit layer 12 and between the ceramic substrate 11 and the metal layer 13.

In the above-described insulating circuit board (ceramic/aluminum joined body) 10 according to the first embodiment, the circuit layer (aluminum member, aluminum plate) 12 and the metal layer (aluminum member, aluminum plate) 13 are respectively formed on one surface and the other surface of the ceramic substrate (ceramic member) 11, but the insulating circuit board according to the invention may have a configuration in which an aluminum plate (aluminum member) is joined to at least one surface of a ceramic substrate (ceramic member) formed of $Si_3N_4$ containing Mg via a joining layer having a Mg-containing SiAlON structure.

Specifically, a configuration can also be employed in which the above-described circuit layer according to the first embodiment is formed of a Cu plate, and an aluminum plate (aluminum member) is joined to only the other surface side of the ceramic substrate via a joining layer having a Mg-containing SiAlON structure.

On the contrary to this, a configuration can also be employed in which an aluminum plate (aluminum member) is joined to only one surface side of the ceramic substrate via a joining layer having a Mg-containing SiAlON structure, and a metal layer made of Cu or the like is provided on the other surface side of the ceramic substrate.

Second Embodiment

Figure 3:
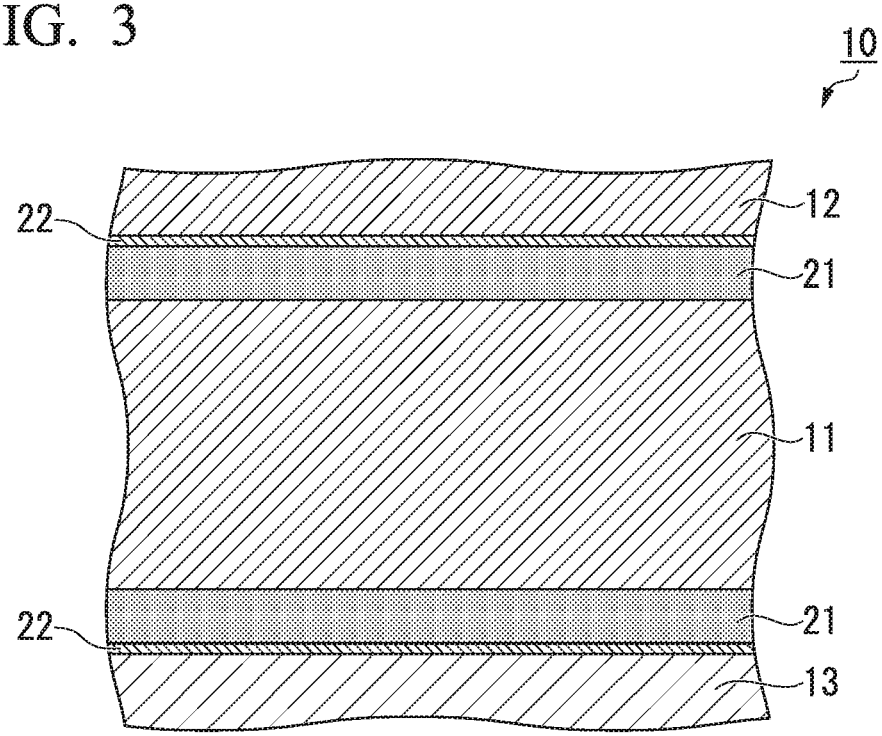
FIG. 3 is an enlarged cross-sectional view of a major part illustrating the vicinity of joining interfaces of a ceramic/aluminum joined body according to a second embodiment.

FIG. 3 is a cross-sectional view illustrating a ceramic/aluminum joined body and an insulating circuit board according to a second embodiment.

Configurations similar to those of the first embodiment will be denoted by the same reference numerals, and detailed descriptions thereof will be omitted.

The ceramic/aluminum joined body according to this embodiment is an insulating circuit board (substrate for power module) 10 having a ceramic substrate (ceramic member) 11 formed of a material in which magnesium (Mg) is contained in $Si_3N_4$ (silicon nitride), a circuit layer (aluminum plate, aluminum member) 12 provided on one surface (upper surface in FIG. 3) of the ceramic substrate 11, and a metal layer (aluminum plate, aluminum member) 13 joined to the other surface (lower surface in FIG. 3) of the ceramic substrate 11.

In addition, a power module 30 according to this embodiment is formed by mounting a semiconductor element 24 such as a power semiconductor element on the circuit layer 12 of the insulating circuit board 10 via a solder layer 23.

In this embodiment, a cooler 14 is formed to be overlapped on a surface of the metal layer 13 on the side opposite to the ceramic substrate 11 to provide an insulating circuit board 20 with a cooler.

FIG. 3 is an enlarged cross-sectional view of a major part illustrating a region including joining interfaces between the ceramic substrate and the circuit layer and between the ceramic substrate and the metal layer.

In this embodiment, the ceramic substrate (ceramic member) 11 and the aluminum plate (aluminum member) are joined to each other using an Al—Si—Mg-based brazing filler material. For example, Al—Si—Mg-based brazing filler material foil is disposed and heated between the ceramic substrate (ceramic member) 11 and the aluminum plate (aluminum member) to be the circuit layer 12 and between the ceramic substrate 11 and the aluminum plate (aluminum member) to be the metal layer 13 to achieve joining at the interfaces therebetween.

At the joining interfaces between the ceramic substrate 11 and the circuit layer 12 and between the ceramic substrate 11 and the metal layer 13, a joining layer 21 in which magnesium (Mg) is contained in an aluminum (Al)-silicon (Si)-oxygen (O)-nitrogen (N) compound is formed.

The joining layer 21 is a layer formed at the joining interface between one surface of the ceramic substrate 11 and the circuit layer 12, and at the joining interface between the other surface of the ceramic substrate 11 and the metal layer 13 in joining between the ceramic substrate 11 and the circuit layer 12 and between the ceramic substrate 11 and the metal layer 13 using an Al—Si—Mg-based brazing filler material. The joining layer 21 is a SiAlON compound containing Mg within a predetermined concentration range.

In this embodiment, an aluminum nitride layer 22 is formed between the joining layer 21 and the circuit layer 12 and between the joining layer 21 and the metal layer 13. The aluminum nitride layer 22 is formed by a reaction of Al with N generated by decomposition of $Si_3N_4$ constituting the ceramic substrate 11 in joining between the ceramic substrate 11 and the aluminum plate constituting the circuit layer 12 or the metal layer 13.

Figure 4:
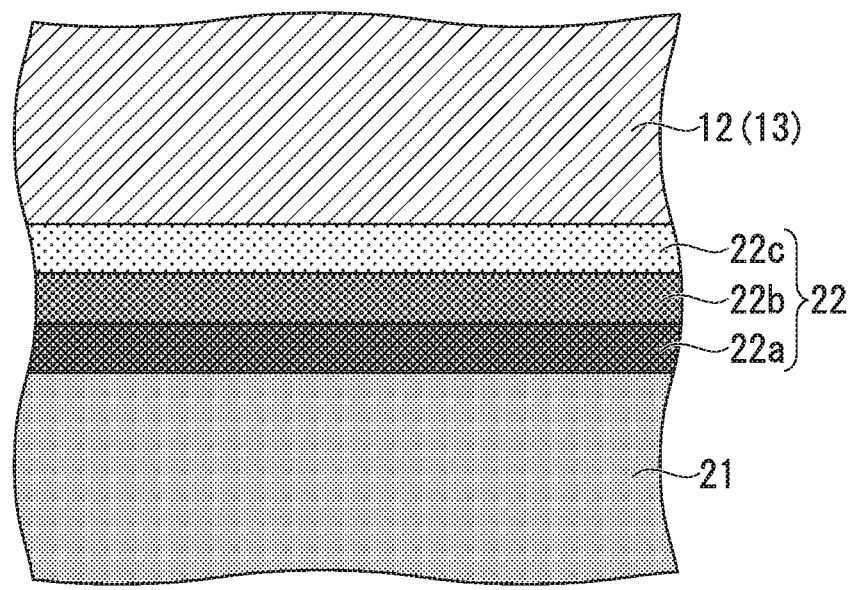
FIG. 4 is an enlarged cross-sectional view of a major part of the aluminum nitride layer of FIG. 3.

Here, the aluminum nitride layer 22 formed between the joining layer 21 and the circuit layer (aluminum member) 12 and between the joining layer 21 and the metal layer (aluminum member) 13 has a first aluminum nitride layer 22a having a high nitrogen concentration and a nitrogen concentration gradient in a thickness direction and a second aluminum nitride layer 22b having a constant nitrogen concentration in order from the joining layer 21 as illustrated in FIG. 4. The N concentration in the first aluminum nitride layer 22a is within a range of 50 at % to 80 at %, and the N concentration on the side of the joining layer 21 is higher than that on the side of the circuit layer 12 or the metal layer 13. The N concentration in the second aluminum nitride layer 22$b$ is within a range of 30 at % to less than 50 at %. The aluminum nitride layer 22 may also contain Mg.

As illustrated in FIG. 4, a third aluminum nitride layer 22$c$ formed of AlN containing oxygen (O) may exist between the second aluminum nitride layer 22$b$ and the circuit layer (aluminum member) 12 and between the second aluminum nitride layer 22$b$ and the metal layer (aluminum member) 13. The third aluminum nitride layer 22$c$ may also contain Mg.

The thickness of the above-described aluminum nitride layer 22 may be within a range of 4 nm to 100 nm. In a case where the thickness of the aluminum nitride layer 22 is 4 nm or greater, $Si_3N_4$ in the vicinity of the joining interface is securely decomposed, and thus it is possible to further improve the joining reliability between the ceramic substrate 11 and the circuit layer (aluminum member) 12 and between the ceramic substrate 11 and the metal layer (aluminum member) 13. In a case where the thickness of the aluminum nitride layer 22 is 100 nm or less, it is possible to suppress the occurrence of cracks of the aluminum nitride layer 22 due to a difference in the coefficient of thermal expansion.

In order to further improve the joining reliability between the ceramic substrate 11 and the circuit layer (aluminum member) 12 and between the ceramic substrate 11 and the metal layer (aluminum member) 13, the lower limit of the thickness of the aluminum nitride layer 22 is preferably 5 nm, and more preferably 15 nm. In order to further suppress the occurrence of cracks of the aluminum nitride layer 22, the upper limit of the thickness of the aluminum nitride layer 22 is preferably 80 nm, and more preferably 60 nm.

Also in the insulating circuit board (ceramic/aluminum joined body) 10 configured as described above, the joining reliability can be increased between the ceramic substrate 11 and the circuit layer 12 and between the ceramic substrate 11 and the metal layer 13 in a case where $Si_3N_4$ (silicon nitride) containing magnesium is used as the ceramic substrate 11, and the joining layer 21 in which a SiAlON compound contains Mg within a predetermined concentration range is formed at the joining interface between one surface of the ceramic substrate 11 and the circuit layer 12, and at the joining interface between the other surface of the ceramic substrate 11 and the metal layer 13.

Accordingly, for example, even under an environment in which a repetitive thermal cycle is applied between a high-temperature state caused by the heat generation of the semiconductor element 24 constituting the power module 30 and a low-temperature state during the non-operation, it is possible to securely prevent the occurrence of fractures or cracks at the joining interfaces between the ceramic substrate 11 and the circuit layer 12 and between the ceramic substrate 11 and the metal layer 13.

In this embodiment, since the aluminum nitride layer 22 is formed between the joining layer 21 and the circuit layer 12 and between the joining layer 21 and the metal layer 13, the joining reliability can be further improved between the ceramic substrate 11 and the circuit layer 12 and between the ceramic substrate 11 and the metal layer 13.

Other than the above-described embodiments, for example, an embodiment in which the circuit layer or the metal layer is formed of an aluminum plate-copper plate joined body can also be applied. In this case, the circuit layer or the metal layer can be formed by, for example, solid-phase diffusion joining a rolled plate of oxygen-free copper and an aluminum plate.

(Method of Manufacturing Insulating Circuit Board Shown in First Embodiment)

Next, an example of a method of manufacturing the insulating circuit board (ceramic/aluminum joined body) shown in the first embodiment will be described.

In the manufacturing of the insulating circuit board (ceramic/aluminum joined body) illustrated in FIG. 1, first, a ceramic substrate (ceramic member) 11 formed of $Si_3N_4$ (silicon nitride) containing magnesium is prepared.

Next, a magnesium elicitation treatment is performed to elicitate a magnesium compound such as a magnesium oxide (MgO) to one surface side (surface side on which a circuit layer is joined) and the other surface side (surface side on which a metal layer is joined) of the ceramic substrate 11 formed of $Si_3N_4$ (silicon nitride) containing magnesium. Specifically, for example, first, a honing treatment is performed to clean the one surface side and the other surface side of the ceramic substrate 11.

Examples of the honing treatment include dry-honing using a polishing tool and wet honing using a polishing liquid containing polishing particles. Through the honing treatment, impurities existing on the surface of the ceramic substrate 11 are removed for cleaning.

Next, an etching treatment is performed using an alkali liquid on the ceramic substrate 11 subjected to the honing treatment. In the etching treatment, impurities such as alumina ($Al_2O_3$) and a yttrium oxide ($Y_2O_3$) existing on one surface side and the other surface side of the ceramic substrate 11 are dissolved and removed, and a magnesium compound such as a magnesium oxide (MgO) having excellent etching resistance to the alkali liquid is selectively allowed to remain.

By performing the magnesium elicitation treatment, the magnesium compound on one surface side and the other surface side of the ceramic substrate 11 is elicited. For example, the concentration of the magnesium compound of the surface of the ceramic substrate 11 increases. The magnesium concentration of the surface of the ceramic substrate 11 is, but not limited to, preferably 0.4 at % to 1.4 at %, more preferably 0.5 at % to 1.2 at %, and even more preferably 0.62 at % to 1.01 at %.

In the etching treatment using an alkali liquid, sodium hydroxide aqueous solutions, ammonia water, organic amines, and aqueous solutions thereof can be used. For example, in a case where a sodium hydroxide aqueous solution is used, a sodium hydroxide aqueous solution having a pH of 12 to 14 can be used. The etching treatment time is within a range of 5 minutes to 30 minutes, and preferably within a range of 10 minutes to 20 minutes. In addition, the etching treatment can be performed within a range of 70° C. to 90° C.

By performing the etching treatment using an alkali liquid within these ranges, the magnesium compound of the surface on one surface side and the other surface side of the ceramic substrate 11 can be elicited, particle shedding or an increase in the surface roughness of the ceramic substrate 11 by the alkali liquid can be prevented, and a reduction in the joining property or the joining reliability can be prevented.

Next, brazing filler material foil or a brazing filler material paste composed of an aluminum alloy containing 1 mass % to 12 mass % of Si is disposed on one surface side and the other surface side of the ceramic substrate 11 subjected to the elicitation of the magnesium compound. In a case where brazing filler material foil is used, a foil material having a thickness of 5 μm to 30 μm may be used. In a case where a brazing filler material paste is used, the paste may be applied such that the thickness calculated in terms of metal component is within a range of 5 μm to 30 μm. The thickness calculated in terms of metal component refers to a value which is obtained by converting into a thickness per unit area using a weight (metal component weight) obtained by excluding an organic component weight calculated from a compounding ratio of a brazing filler material paste from a weight of the brazing filler material paste applied and using a ratio of Al to Si of an aluminum alloy used in the brazing filler material paste. An aluminum plate (aluminum member) is overlapped on the brazing filler material foil or brazing filler material paste. The above-described laminate is put into a heating furnace and heated while being pressurized in a lamination direction. The applied pressure is preferably 0.098 MPa to 3.43 MPa.

In this manner, the brazing filler material and a part of the aluminum plate are melted, and a melted metal region is formed at an interface between the aluminum plate and the ceramic substrate. As the conditions of the heating step, the atmosphere is a vacuum atmosphere ($10^{-4}$ Pa to $10^{-3}$ Pa) or a nitrogen atmosphere with an oxygen partial pressure of 500 volppm or less, the joining temperature is within a range of 580° C. to 650° C., and the heating time is within a range of 1 minute to 180 minutes. Due to the heating step, a joining layer 21 with Mg-containing SiAlON is formed up to a deep portion of the ceramic substrate 11.

The composition ratio of the joining layer 21 obtained as described above is specified such that silicon is 10 at % to 18 at %, oxygen is 20 at % to 35 at %, nitrogen is 25 at % to 40 at %, and magnesium is 3 at % to 8 at % with the balance aluminum. As an example of the composition ratio of the joining layer 21, silicon is 11.7 at %, oxygen is 25.4 at %, nitrogen is 36.5 at %, magnesium is 3.9 at %, and aluminum is 22.5 at %.

In addition, at the joining interfaces between the ceramic substrate (ceramic member) 11 and the circuit layer (aluminum member) 12 and between the ceramic substrate 11 and the metal layer (aluminum member) 13, the copper concentration at positions separated by 10 μm from the surface of the ceramic substrate (ceramic member) 11 toward the circuit layer (aluminum member) 12 and the metal layer (aluminum member) 13 is preferably 1.2 mass % or less and the iron concentration at positions separated by 10 μm from the surface of the ceramic substrate (ceramic member) 11 toward the circuit layer (aluminum member) 12 and the metal layer (aluminum member) 13 is 0.6 mass % or less.

In the insulating circuit board (ceramic/aluminum joined body) 10 according to the first embodiment obtained as described above, the compound with a magnesium-containing sialon structure is formed up to a deeper region in the ceramic substrate 11, than in a case where a ceramic substrate containing no magnesium is used. Accordingly, the joining strengths between the ceramic substrate 11 and the circuit layer 12 and between the ceramic substrate 11 and the metal layer 13 are increased, and thus the joining reliability is improved.

In addition, in a case where, at the joining interfaces between the ceramic substrate (ceramic member) 11 and the circuit layer 12 and between the ceramic substrate 11 and the metal layer 13, the copper concentration at positions separated by 10 μm from the surface of the ceramic substrate (ceramic member) 11 toward the circuit layer (aluminum member) 12 and the metal layer (aluminum member) 13 is 0.6 mass % or less, it is possible to suppress excessive hardening of the vicinity of the joining interface with the ceramic substrate 11 in the circuit layer 12 and the metal layer 13. Accordingly, it is possible to suppress the occurrence of fractures or cracks of the ceramic substrate 11. The copper and the iron are derived from impurities contained in the aluminum plate and the brazing filler material.

Then, in the manufacturing of an insulating circuit board 20 with a cooler using the obtained insulating circuit board (ceramic/aluminum joined body) 10, a cooler 14 made of aluminum or an aluminum alloy is joined to be overlapped on a surface of the metal layer 13 on the side opposite to the ceramic substrate 11 using, for example, Al—Si-based brazing filler material. Accordingly, the insulating circuit board 20 with a cooler can be manufactured.

(Method of Manufacturing Insulating Circuit Board Shown in Second Embodiment)

Next, an example of a method of manufacturing the insulating circuit board (ceramic/aluminum joined body) shown in the second embodiment will be described.

The method of manufacturing the insulating circuit board shown in the second embodiment is different from the above-described method of manufacturing the insulating circuit board shown in the first embodiment in that an Al—Si—Mg-based brazing filler material is used for joining between the ceramic substrate and the aluminum plate.

As the Al—Si—Mg-based brazing filler material, brazing filler material foil or a brazing filler material paste composed of an aluminum alloy containing 1 mass % to 12 mass % of Si and greater than 0 mass % to 0.20 mass % of Mg can be used. In a case where brazing filler material foil is used, a foil material having a thickness of 5 μm to 30 μm may be used. In a case where a brazing filler material paste is used, the paste may be applied such that the thickness calculated in terms of metal component is within a range of 5 μm to 30 μm.

The Mg content is preferably within a range of 0.05 mass % to 0.20 mass %.

By joining the ceramic substrate and the aluminum plate using the Al—Si—Mg-based brazing filler material, a joining layer 21 containing 10 at % to 18 at % of silicon, 20 at % to 35 at % of oxygen, 25 at % to 40 at % of nitrogen, and 3 at % to 8 at % of magnesium with the balance aluminum is formed, and an aluminum nitride layer 22 is formed between the joining layer 21 and the circuit layer 12 and between the joining layer 21 and the metal layer 13.

Although the embodiments of the invention have been described, these embodiments have been shown as just examples, and are not intended to limit the scope of the invention. These embodiments can be implemented in various forms, and various omissions, replacements, additions, and changes can be made without departing from the gist of the invention. The embodiments and modifications thereof are included in the scope or gist of the invention as well as within the invention described in the claims and the equivalent scope thereof.

In addition, in this embodiment, a description has been given in which a power module is configured by mounting a power semiconductor element on the insulating circuit board, but the invention is not limited thereto. For example, a LED module may be configured by mounting a LED element on the circuit layer of the insulating circuit board, or a thermoelectric module may be configured by mounting a thermoelectric element on the circuit layer of the insulating circuit board. As the thermoelectric element, for example, magnesium silicide, manganese silicide, $Bi_2Te_3$, PbTe, $CoSb_3$, SiGe, or the like can be used.

Furthermore, in this embodiment, a description has been given in which aluminum plates are joined to one surface and the other surface of the ceramic substrate, respectively, to form the circuit layer and the metal layer, but the invention is not limited thereto. An aluminum plate may be joined only to one surface of the ceramic substrate to form the circuit layer with no formation of the metal layer, or the metal layer may be formed of another metal or the like. In addition, an aluminum plate may be joined only to the other surface of the ceramic substrate to form the metal layer, and the circuit layer may be formed of another metal or the like.

EXAMPLES

Hereinafter, examples for verification of the effects of the embodiments will be shown.

Example 1

First, a silicon nitride substrate (40 mm×40 mm×0.32 mm thickness) was produced by the method described in the above-described embodiment such that the Mg concentration of a surface of the silicon nitride substrate was as shown in Table 1. The Mg concentration was obtained by performing electron probe microanalyzer (EPMA) analysis on the surface. In the EPMA analysis, the measurement was performed at 10 points (point analysis) using FE-EPMA JXA-8530F manufactured by JEOL Ltd. with an accelerating voltage of 15 kV and a beam current of 50 nA, and an average value was set as the Mg concentration.

Via brazing filler material foil (37 mm×37 mm×0.015 mm thickness) shown in Table 1, an Al plate (37 mm×37 mm×0.6 mm thickness) to be a circuit layer, composed of an Al plate member shown in Table 1, was laminated on one surface of the obtained silicon nitride, and an Al plate (37 mm×37 mm×1.6 mm thickness) to be a metal layer, composed of an Al plate member shown in Table 1, was laminated on the other surface. These were heated while being pressurized at 5 kgf/cm$^2$ in a lamination direction to join the Al plate and the ceramic substrate, and thus an insulating circuit board was produced. The heating temperature, the heating time, and the atmosphere were as shown in Table 1. A heat sink (A6063, 50 mm×60 mm×5 mm thickness) was joined to the metal layer of the obtained insulating circuit board using an Al—Si-based brazing filler material. The joining was performed at a heating temperature of 610° C. in a vacuum with a load of 3.0 kgf/cm$^2$ in the lamination direction.

Regarding the obtained insulating circuit board, the presence or absence of a joining layer, the Mg concentration in the joining layer, the Cu concentration and the Fe concentration of an interface, and the joining ratios (initial joining ratio and joining ratio after thermal cycle) were measured.

(Method of Confirming Joining Layer and Method of Measuring Each Element Concentration of Joining Layer and Interface)

The insulating circuit board was mechanically cut in the lamination direction (thickness direction). The obtained cross-section was mechanically polished up to a thickness of about 50 μm, and set as a cross-section sample. Then, 4 kV of argon ions were made incident at an angle of 4 degrees from the upper and lower sides (surfaces vertical to the lamination direction) in the vicinity of the joining interface, thereby performing thinning until holes were formed in the cross-section sample by sputtering. The rim of a hole had an edge shape and had a thickness of about 0.1 μm, allowing transmission of electron beams, and thus this part was observed by a transmission electron microscope (TEM) and an energy dispersive X-ray spectrometer (EDS) to determine the presence or absence of a joining layer and to measure each element concentration of the joining layer and the interface. The measurement by the TEM and the EDS was performed using Titan ChemiSTEM (with EDS detector) manufactured by FEI Company with an accelerating voltage of 200 kV at 450,000 to 910,000-fold magnification. A region where Mg, Si, Al, O, and N overlapped in the mapping of the vicinity of the interface was determined as a joining layer. In a case where no region where Mg, Si, Al, O, and N overlapped existed, it was determined that no joining layer was provided. Regarding the joining layer specified as described above, the Mg concentration in the joining layer was obtained by an EDS (beam diameter: 1 nm).

The cross-section of the joining interface of the insulating circuit board was observed using EPMA (JXA-8539F manufactured by JEOL Ltd., magnification: 1000 times), and the Cu concentration and the Fe concentration were measured at a position separated by 10 μm from the surface of the ceramic substrate (silicon nitride substrate) toward the circuit layer (Al plate). The measurement was performed at 5 points, and average values were set as a Cu concentration and Fe concentration, respectively. In specifying the position separated by 10 μm from the surface of the ceramic substrate toward the circuit layer, the cross-section was subjected to line analysis from the ceramic substrate side to the circuit layer side in the thickness direction, and a position where the initial Al concentration was 90 mass % or greater was determined to be the surface of the ceramic substrate (silicon nitride substrate).

((Evaluation of Joining Ratio))

Using a thermal shock testing device (TSB-51 manufactured by ESPEC Corporation), a cycle of −40° C.×5 minutes and 150° C.×5 minutes set as one cycle was executed 2,000 times on the insulating circuit board in a liquid phase (FLUORINERT).

After that, the joining ratio between the circuit layer and the ceramic substrate was evaluated as follows. The evaluation of the joining ratio was performed before and after the thermal cycle test (initial joining ratio) (joining ratio after thermal cycle).

In the evaluation of the joining ratio, the joining ratio of the interface between the ceramic substrate and the metal layer in the insulating circuit board was evaluated using an ultrasonic flaw detector (FineSAT200 manufactured by Hitachi Power Solutions Co., Ltd.), and calculated using the following formula.

Here, an initial joining area was an area to be joined before joining, and in this example, the initial joining area was an area of the metal layer (37 mm×37 mm).

(Joining Ratio)=((Initial Joining Area)−(Peeling Area))/(Initial Joining Area)

In an image obtained by substituting an ultrasonic flaw image to binarization, the peeling was expressed as a white portion in the joined portion, and thus the area of the white portion was defined as a peeling area.

The results are shown in Table 1.

TABLE 1

| | Al Plate Member for Circuit Layer/Metal Layer | | | Brazing Filler Material Foil | | | Si₃N₄ Substrate Mg | Joining Conditions |
|---|---|---|---|---|---|---|---|---|
| | Al | Cu mass % | Fe mass % | Al | Si mass % | Mg mass % | (surface) at % | Temperature ° C. |
| Example 1 | Balance | 0.00 | 0.01 | Balance | 7.5 | 0.00 | 0.42 | 650 |
| Example 2 | Balance | 0.00 | 0.00 | Balance | 7.5 | 0.20 | 0.64 | 630 |
| Example 3 | Balance | 0.98 | 0.39 | Balance | 7.5 | 0.00 | 0.60 | 640 |
| Example 4 | Balance | 1.18 | 0.27 | Balance | 7.5 | 0.00 | 0.69 | 620 |
| Example 5 | Balance | 0.74 | 0.50 | Balance | 7.5 | 0.01 | 0.75 | 580 |
| Example 6 | Balance | 0.85 | 0.76 | Balance | 7.5 | 0.00 | 0.62 | 580 |
| Example 7 | Balance | 0.01 | 0.02 | Balance | 7.5 | 0.00 | 0.72 | 630 |
| Example 8 | Balance | 0.01 | 0.00 | Balance | 1.5 | 0.05 | 0.45 | 630 |
| Example 9 | Balance | 0.00 | 0.00 | Balance | 5.5 | 0.10 | 0.79 | 630 |
| Example 10 | Balance | 0.02 | 0.02 | Balance | 12.0 | 0.00 | 0.74 | 630 |
| Example 11 | Balance | 0.02 | 0.00 | Balance | 7.5 | 0.50 | 0.47 | 650 |
| Example 12 | Balance | 0.01 | 0.00 | Balance | 7.5 | 0.00 | 0.00 | 630 |

| | Joining Conditions | | Joining Layer | Concentration at Joining Layer Mg at % | Interface | | Joining Ratio | After |
|---|---|---|---|---|---|---|---|---|
| | Time minutes | Atmosphere | Presence or Absence | Mg at % | Cu mass % | Fe mass % | Initial % | Thermal Cycle % |
| Example 1 | 60 | Vacuum | Presence | 3.1 | 0.00 | 0.01 | 97.1 | 91.1 |
| Example 2 | 90 | Vacuum | Presence | 7.8 | 0.00 | 0.00 | 98.7 | 90.7 |
| Example 3 | 150 | Vacuum | Presence | 7.4 | 1.18 | 0.47 | 98.3 | 90.5 |
| Example 4 | 150 | Vacuum | Presence | 6.8 | 1.41 | 0.32 | 98.2 | 87.2 |
| Example 5 | 90 | Vacuum | Presence | 4.8 | 0.89 | 0.60 | 99.4 | 92.7 |
| Example 6 | 120 | Vacuum | Presence | 4.6 | 1.02 | 0.91 | 97.4 | 89.9 |
| Example 7 | 30 | Vacuum | Presence | 3.9 | 0.01 | 0.02 | 97.8 | 91.5 |
| Example 8 | 30 | Vacuum | Presence | 5.5 | 0.01 | 0.00 | 98.0 | 92.4 |
| Example 9 | 10 | Nitrogen | Presence | 6.9 | 0.00 | 0.00 | 97.3 | 91.8 |
| Example 10 | 10 | Nitrogen | Presence | 5.0 | 0.02 | 0.02 | 98.0 | 94.2 |
| Example 11 | 60 | Vacuum | Presence | 12.1 | 0.02 | 0.00 | 98.5 | 78.2 |
| Example 12 | 30 | Vacuum | Absence | — | 0.01 | 0.00 | 87.1 | 0.0 |

From the results of Table 1, it was found that in Examples 1 to 10 in which the joining layer was formed and the magnesium concentration of the joining layer was within a range of 3 at % to 8 at %, an insulating circuit board (ceramic/aluminum joined body) having a high initial joining ratio, a high joining ratio after the thermal cycle, and high joining reliability is obtained. In Example 12 in which no joining layer was formed, the joining ratio after the thermal cycle was significantly lowered. In Example 11 in which the magnesium concentration of the joining layer was greater than 8 at %, the joining ratio after the thermal cycle was slightly lower than in Examples 1 to 10.

Example 2

A silicon nitride substrate (40 mm×40 mm×0.32 mm thickness) was produced by the method described in the above-described embodiment such that the Mg concentration of a surface of the silicon nitride substrate ($Si_3N_4$ substrate) was as shown in Table 2. The Mg concentration of the surface of the silicon nitride substrate was measured by the same method as in Example 1.

Via brazing filler material foil, an Al plate (37 mm×37 mm×0.6 mm thickness) to be a circuit layer was laminated on one surface of the obtained silicon nitride substrate, and an Al plate (37 mm×37 mm×1.6 mm thickness) to be a metal layer was laminated on the other surface. Here, the Al plates to be a circuit layer and a metal layer, respectively, contained 0.01 mass % of Cu and 0.02 mass % of Fe with the balance Al. In addition, the brazing filler material (37 mm×37 mm×0.010 mm thickness) had a composition of Al-7.5 mass % of Si, and a brazing filler material containing no Mg was used.

By heating during pressurization at 5 kgf/cm² in a lamination direction, the Al plate and the ceramic substrate were joined, and an insulating circuit board was produced. The heating temperature, the heating time, and the atmosphere were as shown in Table 2.

A heat sink (A6063, 50 mm×60 mm×5 mm thickness) was joined to the metal layer of the obtained insulating circuit board using an Al—Si-based brazing filler material. The joining of the heat sink was performed at a heating temperature of 610° C. in a vacuum with a load of 3.0 kgf/cm² in the lamination direction.

Regarding the obtained insulating circuit board, the thickness of the aluminum nitride layer, the Mg concentration in the joining layer, and the joining ratios (initial joining ratio and joining ratio after thermal cycle) were measured.

Figure 5:
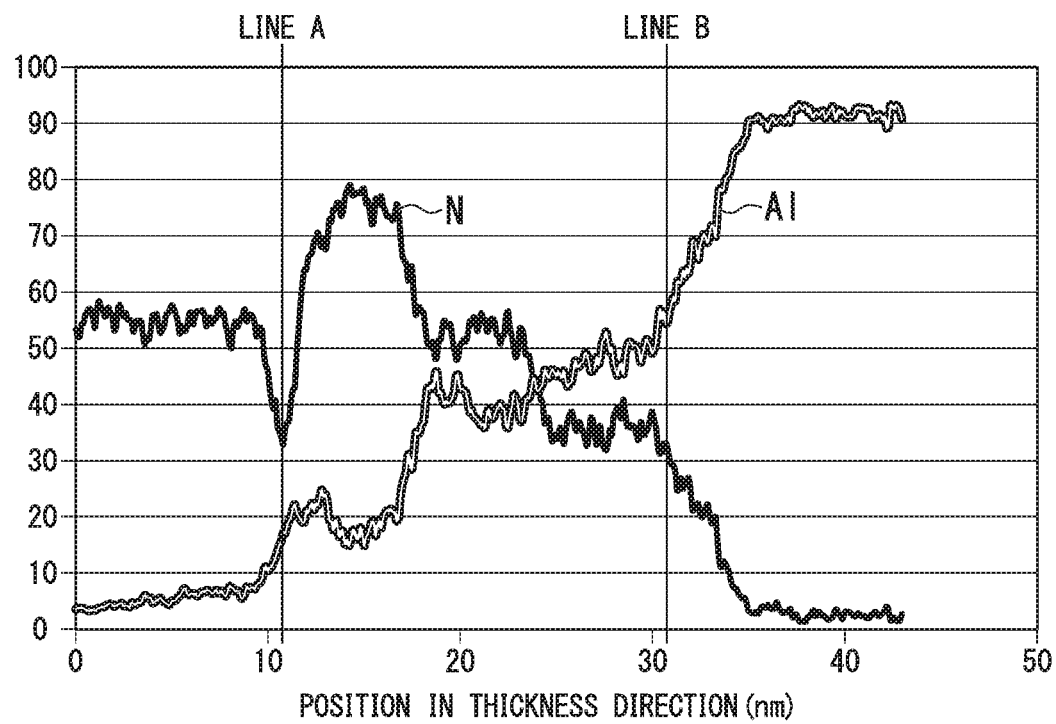
FIG. 5 is a graph illustrating an example of the measurement of a thickness of an aluminum nitride layer in Example 2.

Here, regarding the thickness of the aluminum nitride layer, a cross-section of the joining interface between the silicon nitride substrate and the metal layer was subjected to line analysis using a transmission electron microscope (Titan ChemiSTEM manufactured by FEI Company). A region where Al was 15 at % to 60 at % and N was 30 at % to 80 at % with respect to 100 at % of the total of Al, Si, O, N, and Mg was defined as an aluminum nitride layer, and a thickness thereof was measured. For example, as illustrated in FIG. 5, a region between the line A and the line B is the aluminum nitride layer. Here, in FIG. 5, the vertical line represents the Al or N content (at %) in a case where the total of Al, Si, O, N, and Mg is 100 at % in the line analysis, and the horizontal line represents a position (nm) in the thickness direction.

The Mg concentration in the joining layer and the joining ratios (initial joining ratio and joining ratio after thermal cycle) were evaluated by the methods described in Example 1, respectively.

TABLE 2

| | Silicon Nitride Substrate | Joining Conditions | | Aluminum Nitride Layer | Joining Ratio | |
|---|---|---|---|---|---|---|
| | | | | | | After |
| | Mg Concentration (at %) | Temperature (° C.) | Time (minutes) | Thickness (nm) | Initial (%) | Thermal Cycle (%) |
| Example 21 | 0.11 | 580 | 30 | 0.0 | 97.2 | 84.6 |
| Example 22 | 0.41 | 580 | 120 | 4.0 | 99.0 | 88.1 |
| Example 23 | 0.43 | 600 | 60 | 5.0 | 97.3 | 89.2 |
| Example 24 | 0.62 | 610 | 60 | 15.8 | 97.6 | 90.8 |
| Example 25 | 0.62 | 630 | 30 | 18.1 | 98.6 | 91.2 |
| Example 26 | 0.79 | 630 | 90 | 29.8 | 97.8 | 92.0 |
| Example 27 | 0.81 | 630 | 120 | 31.1 | 99.0 | 93.9 |
| Example 28 | 1.01 | 640 | 45 | 35.2 | 98.6 | 94.2 |
| Example 29 | 1.10 | 640 | 90 | 57.8 | 97.6 | 94.6 |
| Example 30 | 1.13 | 650 | 60 | 76.9 | 98.1 | 93.5 |
| Example 31 | 1.33 | 650 | 90 | 100.0 | 97.3 | 85.4 |
| Example 32 | 1.53 | 650 | 150 | 137.8 | 97.7 | 79.5 |

From the results of Table 2, it was confirmed that the joining reliability is further improved in a case where the thickness of the aluminum nitride layer is within a range of 4 nm to 100 nm. It was also confirmed that the joining reliability is further improved in a case where the thickness of the aluminum nitride layer is within a range of 15.8 nm to 76.9 nm.

INDUSTRIAL APPLICABILITY

In a ceramic/aluminum joined body and an insulating circuit board according to the invention, a ceramic member and an aluminum member are joined to each other with high joining reliability, and thus the ceramic/aluminum joined body and the insulating circuit board are suitable for a power module, a LED module, and a thermoelectric module.

REFERENCE SIGNS LIST

10: INSULATING CIRCUIT BOARD (CERAMIC/ALUMINUM JOINED BODY)
11: CERAMIC SUBSTRATE (CERAMIC MEMBER)
12: CIRCUIT LAYER (ALUMINUM PLATE, ALUMINUM MEMBER)
13: METAL LAYER (ALUMINUM PLATE, ALUMINUM MEMBER)
14: COOLER
21: JOINING LAYER
22: ALUMINUM NITRIDE LAYER
24: SEMICONDUCTOR ELEMENT
30: POWER MODULE

The invention claimed is:

1. A ceramic/aluminum joined body, comprising:
a ceramic member; and
an aluminum member made of aluminum or an aluminum alloy,
wherein the ceramic member and the aluminum member are joined to each other,
the ceramic member is formed of silicon nitride containing magnesium,
a joining layer in which magnesium is contained in an aluminum-silicon-oxygen-nitrogen compound is formed at a joining interface between the ceramic member and the aluminum member, and
wherein a composition ratio of the joining layer is specified such that silicon is 10 at % to 18 at %, oxygen is 20 at % to 35 at %, nitrogen is 25 at % to 40 at %, and magnesium is 3 at % to 8 at % with the balance aluminum.

2. The ceramic/aluminum joined body according to claim 1,
wherein copper is 1.2 mass % or less and iron is 0.6 mass % or less at a position separated by 10 μm from a surface of the ceramic member toward the aluminum member.

3. An insulating circuit board, comprising:
a ceramic substrate; and
an aluminum plate made of aluminum or an aluminum alloy,
wherein the ceramic substrate and the aluminum plate are joined to each other,
the ceramic substrate is formed of silicon nitride containing magnesium,
a joining layer in which magnesium is contained in an aluminum-silicon-oxygen-nitrogen compound is formed at a joining interface between the ceramic substrate and the aluminum plate, and
wherein a composition ratio of the joining layer is specified such that silicon is 10 at % to 18 at %, oxygen is 20 at % to 35 at %, nitrogen is 25 at % to 40 at %, and magnesium is 3 at % to 8 at % with the balance aluminum.

4. The insulating circuit board according to claim 3,
wherein copper is 1.2 mass % or less and iron is 0.6 mass % or less at a position separated by 10 μm from a surface of the ceramic substrate toward the aluminum plate.

5. A power module, comprising:
the insulating circuit board according to claim 3; and
a power semiconductor element which is mounted on the insulating circuit board.

6. A LED module, comprising:
the insulating circuit board according to claim 3; and
a LED element which is mounted on the insulating circuit board.

7. A thermoelectric module, comprising:
the insulating circuit board according to claim 3; and
a thermoelectric element which is mounted on the insulating circuit board.

* * * * *